(12) United States Patent
Sugimoto et al.

(10) Patent No.: US 7,495,183 B2
(45) Date of Patent: Feb. 24, 2009

(54) ELECTRONIC CIRCUIT APPARATUS

(75) Inventors: Keiichi Sugimoto, Kariya (JP); Mitsuru Nakagawa, Chiryu (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/406,503

(22) Filed: Apr. 19, 2006

(65) Prior Publication Data

US 2006/0250756 A1 Nov. 9, 2006

(30) Foreign Application Priority Data

Apr. 19, 2005 (JP) .............................. 2005-121310

(51) Int. Cl.
*H01L 23/34* (2006.01)
(52) U.S. Cl. ..................... 174/526; 174/520; 361/714; 361/719
(58) Field of Classification Search ................ 174/522, 174/526, 520; 361/714, 709, 710, 711, 719; 165/80.3
See application file for complete search history.

(56) References Cited

U.S. PATENT DOCUMENTS

| 5,586,388 | A | * | 12/1996 | Hirao et al. ................. 29/830 |
| 6,950,305 | B2 | * | 9/2005 | Miles et al. ................. 361/690 |
| 7,151,674 | B2 | * | 12/2006 | Sasaki et al. ................ 361/752 |
| 2004/0022031 | A1 | | 2/2004 | Miles et al. |
| 2004/0037043 | A1 | * | 2/2004 | Ku ............................ 361/718 |
| 2004/0070946 | A1 | * | 4/2004 | Matsuo et al. .............. 361/709 |
| 2004/0160731 | A1 | | 8/2004 | Yamaguchi |
| 2005/0078454 | A1 | * | 4/2005 | Hyodo ........................ 361/712 |
| 2005/0088827 | A1 | * | 4/2005 | Zhang ........................ 361/720 |
| 2006/0272150 | A1 | | 12/2006 | Eguchi et al. |

FOREIGN PATENT DOCUMENTS

| JP | 6-53621 | 2/1994 |
| JP | 9-69585 | 3/1997 |
| JP | 10-79453 | 3/1998 |
| JP | 10-224056 | 8/1998 |
| JP | 10-242675 | 9/1998 |
| JP | 11-346418 | 12/1999 |
| JP | 2000-223623 | 8/2000 |
| JP | 2003-78107 | 3/2003 |
| KR | 10-0260347 | 7/2000 |
| WO | WO2005/004563 | 1/2005 |

OTHER PUBLICATIONS

English-language translation of Korean Office Action dated May 14, 2007 in Korean Application No. 10-2006-0035200.
Office Action issued Aug. 1, 2008 in corresponding Chinese Application No. 200610073796.9 and translation thereof.

* cited by examiner

*Primary Examiner*—Hung V Ngo
(74) *Attorney, Agent, or Firm*—Nixon & Vanderhye P.C.

(57) ABSTRACT

An electronic circuit apparatus has a casing, a circuit board at which electronic members and power transistors are mounted, and a connector for connecting the circuit board with an external electrical circuit. The casing is insertion-molded by a resin, with the circuit board where the electronic members, the power transistors and the connector have been mounted being held at a predetermined position in a die for molding the casing through the resin. Thus, in the electronic circuit apparatus, damage to circuit components and noise due to a vibration excitation can be restricted, without increasing the number of construction members of the electronic circuit apparatus.

6 Claims, 3 Drawing Sheets

ELECTRONIC CIRCUIT APPARATUS

CROSS REFERENCE TO RELATED APPLICATION

This application is based on a Japanese Patent Application No. 2005-121310 filed on Apr. 19, 2005, the disclosure of which is incorporated herein by reference.

FIELD OF THE INVENTION

The present invention relates to an electronic circuit apparatus.

BACKGROUND OF THE INVENTION

Generally, an electronic circuit apparatus is provided to control operation of various electrical devices mounted at a vehicle or the like.

FIG. 7 shows an engine ECU 100 as a conventional electronic circuit apparatus. The engine ECU 100 has a circuit board 101 where circuit components (not shown) are mounted. The circuit board 101 is fixedly accommodated in a casing 102. The casing 102 includes an accommodation portion 103 and a cover 104. The cover 104 is attached to the accommodation portion 103, after the circuit board 101 is held in the accommodation portion 103. Thus, the circuit board 101 is fixed in the accommodation portion 103.

A connector 105 for electrically connecting the engine ECU 100 with an external electrical circuit is attached to the circuit board 101. The connector 105 is partially exposed to the outside of the casing 102 from an opening 104a arranged at the cover 104 to be capable of electrically connecting with the external electrical circuit, while the circuit board 101 is fixed in the casing 102.

However, in this case, it is difficult to prevent foreign matter such as water from entering the casing 102. Moreover, there is minute gap between the casing 102 and the circuit board 101. Thus, when the engine ECU 100 is excited by an external vibration, the circuit board 101 will vibrate in the casing 102 to cause unusual sound (noise), or the circuit components will deviate from the circuit board 101, or the like.

Furthermore, because the construction member number of the conventional electronic circuit apparatus is large, the mounting labor will increase.

SUMMARY OF THE INVENTION

In view of the above-described disadvantages, it is an object of the present invention to provide an electronic circuit apparatus in which noise and damage to circuit components due to a vibration excitation of the electronic circuit apparatus are restricted, without increasing the number of construction members thereof.

According to the present invention, an electronic circuit apparatus is provided with a circuit board at which a plurality of circuit components are mounted, a connector which is mounted at the circuit board to connect the circuit board with an external electrical circuit, and a casing made of a resin. The casing is molded to seal a part of the connector, and a whole of the circuit board and the circuit components in the resin.

Thus, a process for molding the casing and a process for fixing the circuit board into the casing can be completed, by performing a single process where the whole of the circuit board and the circuit components and the part of the connector are sealed by the resin. Therefore, the construction member number and the attachment labor of the electronic circuit apparatus can be reduced.

Moreover, because the circuit board tightly contacts the casing, noise (due to relative motion between circuit board and casing) and malfunction (e.g., deviation of circuit components from circuit board) caused by a vibration of the electronic circuit apparatus can be restricted.

Therefore, the present invention can provide the electronic circuit apparatus where damage to the circuit components and noise generation due to a vibration excitation can be restricted, without increasing the construction member number of the electronic circuit apparatus.

Preferably, the casing has a heat radiation portion which protrudes outward from the casing. The circuit components include an electronic unit which generates heat. The heat radiation portion is arranged at a position corresponding to that of the electronic unit.

For example, a power transistor (being electronic unit) which generates heat can be mounted at the circuit board. In this case, in order to maintain temperatures of the power transistor and other circuit components adjacent thereto respectively within predetermined temperature ranges for normal operations thereof, it is necessary to radiate heat generated by the power transistor or the like to the external.

In a conventional electronic circuit apparatus, because the ambient of the circuit components is air and the circuit board is sealed in the casing having a box shape, it is difficult to radiate heat generated by the circuit component to the external of the casing to maintain the temperatures of the circuit components at suitable values. Moreover, in this case, it is difficult to keep the inner of the casing clean when the casing is provided with a ventilation port for radiating heat.

According to the present invention, the casing is provided with the heat radiation portion, which is positioned corresponding to the electronic component generating heat and protrudes from the casing to have the screen shape, for example. In this case, the electronic unit generating heat is sealed in the resin which constructs the casing. That is, all of the surfaces of the electronic unit other than the surface thereof contacting the circuit board tightly contact the resin, which has a specific heat greatly larger than that of air. Therefore, heat generated by the electronic unit is efficiently transmitted to the casing made of the resin, then transmitted to the inner of the casing and radiated to air from the surface of the heat radiation portion which is formed at the casing.

Accordingly, heat generated by the electronic unit can be efficiently to the external of the casing, so that the temperature of the electronic unit can be substantially maintained within the predetermined range where the electronic unit can normally operate.

More preferably, the casing has at least one attachment portion for fixing the casing to other apparatus.

In the conventional electronic circuit apparatus, a bracket constructed of a metal plate is fixed to the casing. The electronic circuit apparatus is attached to other apparatus via the bracket. Thus, the construction member number of the electronic circuit apparatus is increased. Moreover, in the case where the electronic circuit apparatus is to be attached to vehicles of multiple models, it is necessary to provide multiple kinds of the brackets corresponding to the multiple models of the vehicles so that the cost is increased. According to the present invention, the attachment portion is molded simultaneously at the process for molding the casing through the resin. Thus, the attachment portion (e.g., bracket) can be molded integrally with the casing. Therefore, the increase of the construction member number can be restricted.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE EXAMPLE EMBODIMENTS

First Embodiment

An electronic circuit apparatus according to a first embodiment of the present invention will be described with reference to FIGS. 1-3. The electronic circuit apparatus can be suitably used as an engine ECU 1 (i.e., electronic control unit) for a vehicle, for example.

The engine ECU 1 is fixed in an engine cabin or a passenger compartment of the vehicle, to control an injection amount and an injection time of fuel or the like provided for an engine to be constantly optimal responding to a driving condition of the vehicle.

Figure 2:
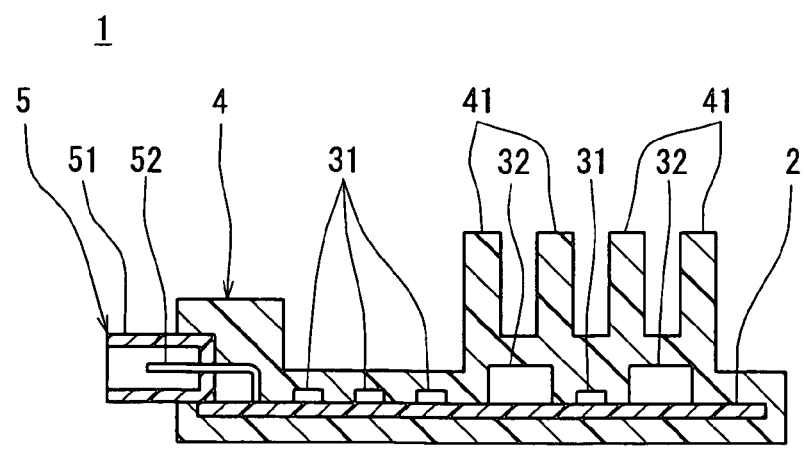
FIG. 2 is a vertical cross-sectional view taken along a line II-II in FIG. 1.

Referring to FIG. 2, the engine ECU 1 has a casing 4, a printed board 2 which is a circuit board accommodated in the casing 4, and a connector 5 for a connection of the engine ECU 1 with an external electrical circuit.

The printed board 2 can be constructed of a board at which wiring pattern is arranged. The board can be made of, for example, a resin such as a glass epoxy resin, a ceramic and the like.

Various circuit components are mounted at the printed board 2 by soldering, for example. The circuit components include electronic members 31, and electronic units 32 (e.g., power transistor) generating heat.

The electronic member 31 can be, for example, a resistor, a condenser, a diode, a transistor, various IC or the like. The electronic member 31 can also have a heat-generating portion, which generates heat in the operation of the engine ECU 1, that is, in the state where a current flows through the electronic member 31. However, the temperature increase of the electronic member 31 is small even without being provided with a heat radiation unit. That is, the electronic member 31 is substantially stable at a temperature, which is significantly lower than a highest temperature up to which the electronic member 31 can maintain a normal operation.

Here, the electronic unit 32 generating heat means that the electronic unit 32 excessively generates heat during the operation of the engine ECU 1, so that the possibility for the temperature of the electronic unit 32 itself to exceed the highest temperature (up to which electronic unit 32 can maintain normal operation) is high if no heat-radiating unit is provided. The electronic unit 32 which generates heat can be not only the power transistor, but also other electronic unit such as various semiconductors for an electric power control or the like.

The connector 5 for connecting the printed board 2 with the external electrical circuit, for example, wire harness (not shown) of the side of the vehicle, is mounted at the printed board 2. As shown in FIG. 2, the connector 5 is constructed of a housing 51 made of a resin or the like, and a pin 52 which is made of an electrically conductive material. One end of the pin 52 is attached to the printed board 2 (by soldering, for example), and other end of the pin 52 is held in the housing 51.

The casing 4, being made of a resin or the like, is molded to seal the printed board 2, the whole of the circuit components and a part of the connector 5 which have been mounted at the printed board 2, in the resin. The circuit components include the electronic member 31 and the electronic unit 32 (e.g., power transistor) which generates heat.

That is, the printed board 2 where the electronic member 31, the power transistor 32 and the connector 5 have been mounted is held at a predetermined position in the cavity of a die for molding the casing 4, and then the casing 4 is constructed by an insertion molding through the resin.

After the molding of the casing 4 is finished, the printed board 2, and the electronic member 31 and the power transistor 32 which are mounted at the printed board 2 is completely embedded in the resin which constructs the casing 4. One part of the connector 5 which is to be combined with a connector (not shown) mounted at the wire harness of the side of the vehicle is exposed from the casing 4, and the other part thereof is completely embedded in the resin. Thus, the electrical circuit in the casing 4 is completely (hermetically) sealed, so that the engine ECU 1 can be made substantially completely watertight.

According to the first embodiment, the resin material constructing the casing 4 can be, for example, a thermosetting resin such as epoxy resin and the like. In the case where the casing 4 is molded by the thermosetting resin via the die, the temperature of the die is to be set suitable for a hardening reaction of the thermosetting resin. The casing 4 is molded with the printed board 2, where the connector 5, the electronic member 31 and the power transistor 32 have been mounted, being inserted in the die.

Therefore, it is required that the temperature necessary for the hardening reaction of the resin material is sufficiently lower than a melting point of a solder used for mounting the connector 5, the electronic member 31 and the power transistor 32 at the printed board 2. The resin material having the hardening-reaction necessary temperature (hardening reaction temperature) which satisfies this requirement is used to construct the casing 4 in this embodiment. Because the melting point of the solder is about 240° C., the epoxy resin which has the hardening reaction temperature of about 170° C. is used as the resin material constructing the casing 4.

Generally, the engine ECU 1 is mounted in the engine cabin of the vehicle. According to the first embodiment, the casing 4 of the engine ECU 1 is constructed of the epoxy resin (being thermosetting resin) to have a higher heat resistance and a higher mechanical strength, so that the reliability of the engine ECU 1 is improved.

According to the first embodiment, in addition to the epoxy resin, the casing 4 can be also constructed of other thermosetting resin, conditioned that the hardening reaction temperature of the thermosetting resin is lower than the melting point of the solder.

Figure 1:
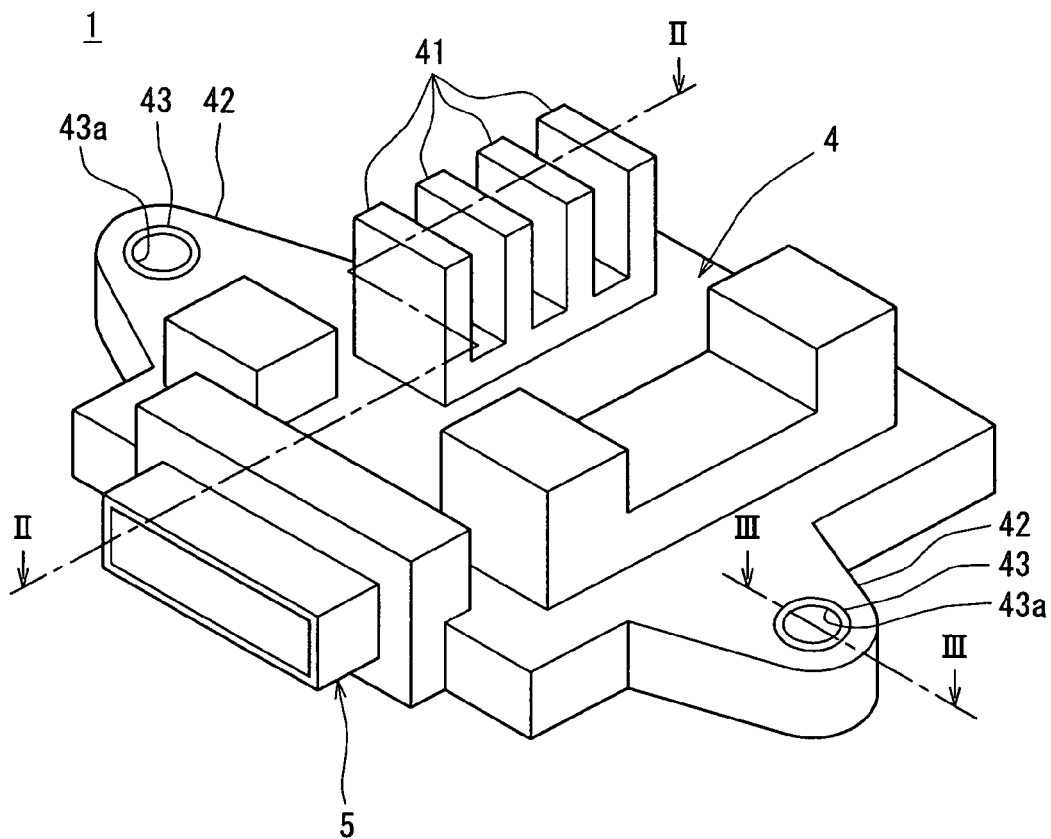
FIG. 1 is a perspective external view showing an engine ECU according to a first embodiment of the present invention.

As shown in FIGS. 1 and 2, the casing 4 has a heat radiation portion which is positioned corresponding to the power transistor 32 (electronic unit which generates heat). The heat radiation portion can be constructed of multiple heat radiation fins 41, each of which protrudes to the outside of the casing 4 to have a substantial thin-plate shape, for example. The heat radiation fins 41 can be arranged to parallel to each other with respect to a direction perpendicular to the surface of the heat radiation fin 41. That is, the heat radiation portion can be provided with a substantial screen shape, for example.

The heat radiation fin 41 is molded integrally with the casing 4. Heat generated by the power transistor 32 is transmitted to the casing 4 from a part of the power transistor 32 which contacts the casing 4, and then radiated to air from an outer surface of the heat radiation fin 41. Thus, heat generated by the power transistor 32 can be radiated to the outside of the casing 4 with a high efficiency, so that the temperature of the power transistor 32 can be substantially maintained within a predetermined range where the power transistor 32 normally operates.

In this case, the area, the thickness, the number and the like of the heat radiation fin 41 are set, so that the temperature of the power transistor 32 can be substantially maintained in the predetermined range.

Referring to FIG. 1 which is a perspective external view showing the engine ECU 1, the casing 4 has at least one attachment member 42 (e.g., totaling two in FIG. 1) for fixing the casing 4 to other apparatus, for example, the engine cabin (not shown) of the vehicle. The attachment member 42 can be constructed of a bracket which is integrally molded with casing 4.

Figure 3:
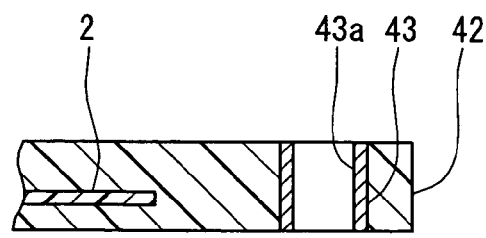
FIG. 3 is a vertical cross-sectional view taken along a line III-III in FIG. 1.

Referring to FIGS. 1 and 3, the bracket 42 is provided with a substantially cylinder-shaped collar 43, which is integrated with the bracket 42 by insertion-molding. The collar 43 can be constructed of a pipe made of a metal such as iron. The casing 4 is fixed to the engine cabin (not shown) by screw-fastening via a bolt (not shown) or the like, which is inserted through a penetration hole 43a defined by the collar 43. In this case, most of a screw axial-force due to the screw fastening is applied to the collar 43 made of the iron, so that an excessive force can be restricted from exerting to the casing 4 made of the resin.

As described above, according to the first embodiment, the casing 4 of the engine ECU 1 is molded to seal the printed board 2, the whole of the electronic member 31 and the power transistor 32, and the one part of the connector 5 which are mounted at the printed board 2, in the resin. That is, the casing 4 is insertion-molded by the resin, in the state where the printed board 2 where the electronic member 31, the power transistor 32 and the connector 5 have been mounted is held at the predetermined position in the die for molding the casing 4.

Thus, the process for molding the casing 4 and the process for mounting the printed board 2 in the casing 4 can be simultaneously completed, by performing the single insertion-molding process where the casing 4 is molded through the resin with the printed board 2 (at which electronic member 31, power transistor 32 and connector 5 having been mounted) being inserted in the die for molding the casing 4. Thus, the construction member number and the assembling labor of the engine ECU 1 can be greatly reduced.

Moreover, according to the first embodiment, the printed board 2, and the electronic member 31 and the power transistor 32 which are mounted at the printed board 2 are completely embedded in the resin material constructing the casing 4. Therefore, the electronic circuit in the casing 4 is completely sealed, so that foreign matter such as water and dust can be restricted from entering the engine ECU 1. Thus, a malfunction (failure) or the like of the engine ECU 1 can be restricted.

Moreover, because the printed board 2 (circuit board) is sealed in the resin material of the casing 4, a relative motion between the printed board 2 and the casing 4 can be restricted. The relative motion may be caused when the engine ECU 1 is excited to vibrate due to, for example, an engine vibration transmitted thereto. Thus, unusual sound (noise) caused by the relative motion or the like can be substantially restricted. In contrast, in the conventional electronic circuit apparatus, noise will be caused due to the relative motion between the circuit board and the casing when the electronic circuit apparatus is excited to vibrate.

According to the present invention, the first embodiment can provide the engine ECU 1 in which damage to the circuit components and noise generation due to a vibration of the engine ECU 1 can be restricted, without increasing the construction member number of the engine ECU 1.

Considering a noise-resistance performance, an adjustment operation performance and the like, the engine ECU 1 is generally arranged at a position close to the engine as possible, for example, in the engine cabin, where the temperature is high and the vibration is severe for the engine ECU 1 as the electronic circuit apparatus.

According to the first embodiment, the engine ECU 1 is provided with the casing 4 which is constructed of the epoxy resin (being thermosetting resin), so that the heat resistance performance and the mechanical strength of the casing 4 can be heightened. Thus, the reliability of the engine ECU 1 can be improved.

Moreover, according to the first embodiment, the engine ECU 1 is provided with the heat radiation portion constructed of the heat radiation fins 41, each of which protrudes to the outside of the casing 4 to have the substantial thin-plate shape or the like. The heat radiation portion is integrated with the casing 4 and arranged at the position corresponding to that of the power transistor 32, so that heat generated by the power transistor 32 can be radiated to the outside of the casing 4 at a high efficiency. Therefore, the temperature of the power transistor 32 can be substantially maintained in the predetermined range where the power transistor 32 can normally operate.

Second Embodiment

Figure 5:
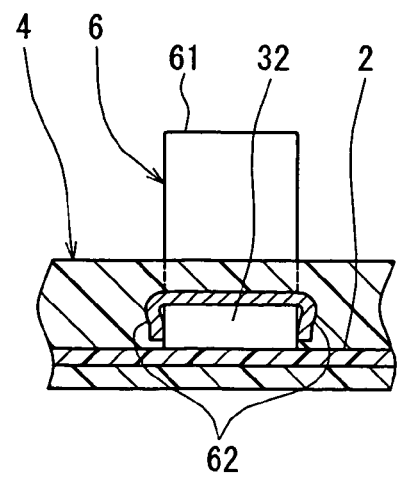
FIG. 5 is a vertical cross-sectional view taken along a line V-V in FIG. 4.
Figure 6:
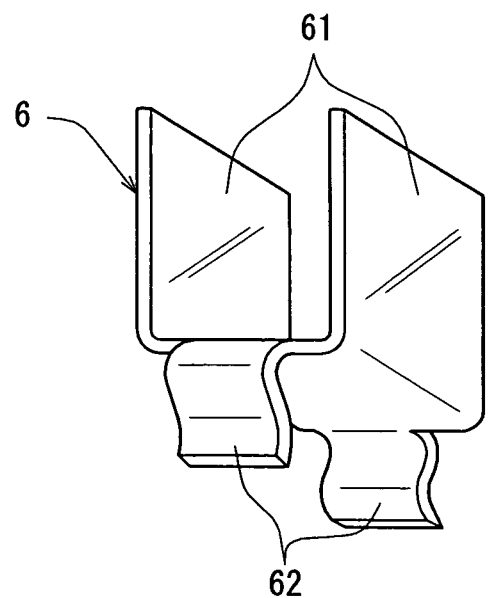
FIG. 6 is a perspective external view showing a heat radiation unit according to the second embodiment.
Figure 7:
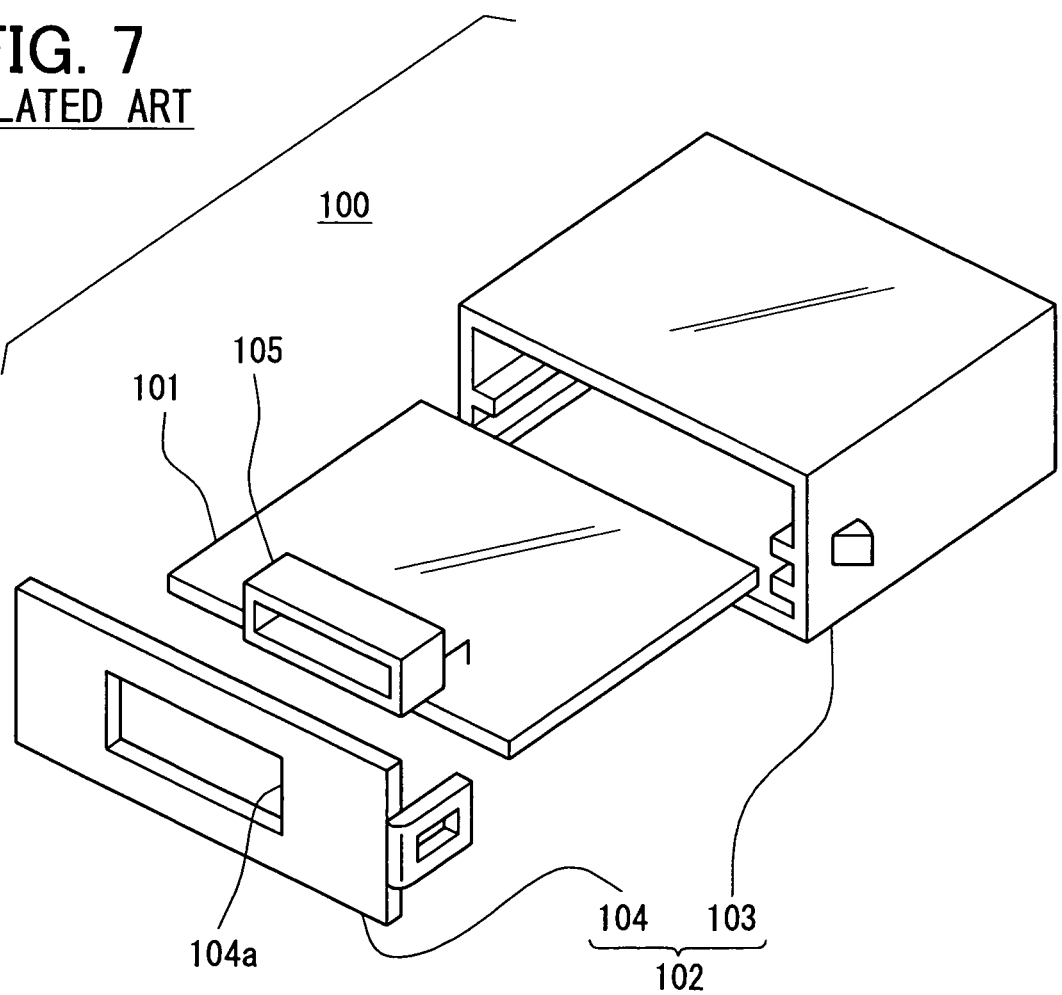
FIG. 7 is a perspective external view showing an electronic circuit apparatus according to a related art.

A second embodiment of the present invention will be described with reference to FIGS. 4-6. In this case, the casing 4 is provided with at least one heat radiation unit 6, instead of the heat radiation fins 41 which are molded integrally with the casing 4 as described in the first embodiment.

Figure 4:
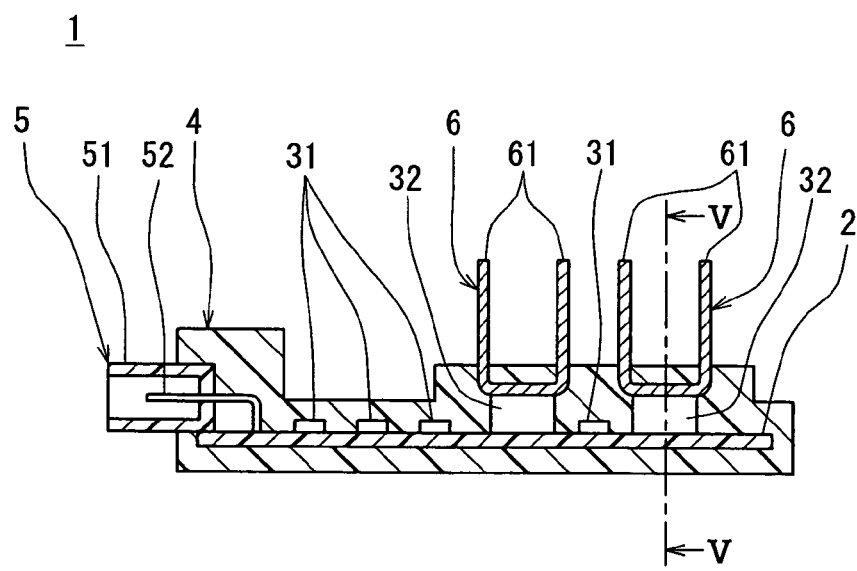
FIG. 4 is a vertical cross-sectional view taken along a line corresponding to II-II in FIG. 1 to show an engine ECU according to a second embodiment of the present invention.

According to the second embodiment, as shown in FIG. 4, the heat radiation unit 6 is constructed of a plate material which is made of metal such as aluminum or the like to have an excellent heat conductivity. The heat radiation unit 6 has a shape shown in FIG. 6 by pressing, for example.

The heat radiation unit 6 includes at least one heat radiation fin 61 (e.g., totaling two in FIGS. 4 and 6) for radiating heat, and a pair of clip portions 62 for fixing the heat radiation unit 6 to the power transistor 32. The clip portions 62 clip the power transistor 32 so that the heat radiation unit 6 is fixedly attached to the power transistor 32, which is mounted at the printed board 2.

The heat radiation fin 61 is manufactured separately from the molding of the casing 4, that is, is a component different from the casing 4. In contrast, the heat radiation fin 41 in the first embodiment is molded integrally with the casing 4 when the casing 4 is molded.

In this case, it is preferable for the heat radiation unit 6 to tightly contact the power transistor 32 so that the heat generated by the power transistor 32 can be transmitted to the heat radiation unit 6 at a high efficiency. A heat radiation gel, a heat radiation grease or the like can be arranged between the power transistor 32 and the heat radiation unit 6, to heighten the heat transmission from the power transistor 32 to the heat radiation unit 6.

In the second embodiment, after the electronic member 31, the power transistor 32 and the connector 5 are mounted at the printed board 2 and the heat radiation unit 6 is fixed to the power transistor 32, the casing 4 is molded with the printed board 2 is inserted in the die for molding the casing 4. After the molding of the casing 4, a part of the heat radiation unit 6, specifically, most of the heat radiation fin 61 is exposed to the outside of the casing 4.

Therefore, according to the second embodiment, the engine ECU 1 can be provided with the effects similar to those described in the first embodiment. That is, the construction member number and the mounting labor of the engine ECU 1 can be greatly reduced, and damage to the circuit components and noise generation due to the vibration of the engine ECU 1 can be restricted.

Moreover, because the engine ECU 1 is provided with the heat radiation unit 6, the radiation of heat generated by the power transistor 32 can be further improved. Therefore, the temperature of the power transistor 32 can be substantially maintained in the predetermined range where the power transistor 32 can normally operate.

Other Embodiments

Although the present invention has been fully described in connection with the preferred embodiments thereof with reference to the accompanying drawings, it is to be noted that various changes and modifications will become apparent to those skilled in the art.

For example, the engine ECU 1 (electronic circuit apparatus) can be provided with both the heat radiation fin 41 which is molded integrally with the casing 4, and the heat radiation fin 61 which is the component different from the casing 4.

Moreover, in addition to the thermosetting resin (e.g., epoxy resin), the casing 4 can be also made of other resin responding to, for example, the use ambient condition of the electronic circuit apparatus. For example, the casing 4 can be made of a thermoplastic resin. In this case, the temperature (resin softening temperature) set to soften the resin in the die-molding process of the casing 4 is to be lower than, the melting point of the solder for mounting the connector 5, the electronic member 31 and the power transistor 32 at the printed board 2.

Furthermore, the present invention can be also suitably used for the electronic circuit apparatus other than the engine ECU 1. The electronic circuit apparatus can be also mounted at various devices, in addition to the vehicle.

Such changes and modifications are to be understood as being in the scope of the present invention as defined by the appended claims.

What is claimed is:

1. An electronic circuit apparatus comprising:
   a circuit board to which a circuit component is fixed by soldering via a solder;
   a connector which is mounted at a connector mounting portion of a surface of the circuit board to connect the circuit board with an external electrical circuit; and
   a casing which is insertion-molded by a resin, wherein:
   the casing is molded to seal a part of the connector, and a whole of the circuit board and the circuit component in the resin, all of surfaces of an assembly of the circuit board and the circuit component other than the connector mounting portion substantially contacting the single resin casing;
   the resin by which the casing is molded has a hardening reaction temperature lower than a melting point of the solder;
   the connector includes a pin which is made of an electrically conductive material, and a housing which is made of a resin and houses therein at least one end of the pin;
   the electronic circuit apparatus further comprises a heat radiation unit;
   the circuit component is an electronic unit which generates heat;
   the heat radiation unit is attached to the circuit board so that heat is transmittable from the electronic unit to the heat radiation unit;
   a part of the heat radiation unit is exposed to an outside of the casing; and the heat radiation unit includes at least one heat radiation fin for radiating heat, and a pair of clip portions which clip the electronic unit so that the heat radiation unit is fixedly attached to the electronic unit.

2. The electronic circuit apparatus according to claim 1, wherein the heat radiation unit is constructed of a plate material made of a metal.

3. The electronic circuit apparatus according to claim 2, wherein the heat radiation unit is made of aluminum.

4. An electronic circuit apparatus comprising:
   a circuit board at which at least one circuit component is mounted;
   a connector which is mounted at the circuit board to connect the circuit board with an external electrical circuit;
   a casing made of a resin, wherein the casing is molded to seal a part of the connector, and a whole of the circuit board and the circuit component in the resin; and a heat radiation unit;
   wherein: the at least one circuit component includes an electronic unit which generates heat;
   the heat radiation unit is attached to the circuit board so that heat is transmittable from the electronic unit to the heat radiation unit;
   a part of the heat radiation unit is exposed to an outside of the casing; and
   the heat radiation unit includes at least one heat radiation fin for radiating heat, and a pair of clip portions which clip the electronic unit so that the heat radiation unit is fixedly attached to the electronic unit.

5. The electronic circuit apparatus according to claim 4, wherein the heat radiation unit is constructed of a plate material made of a metal.

6. The electronic circuit apparatus according to claim 5, wherein the heat radiation unit is made of aluminum.

* * * * *